United States Patent
Merz et al.

(10) Patent No.: US 12,285,994 B2
(45) Date of Patent: Apr. 29, 2025

(54) SENSOR MODULE, PARTICULARLY FOR MEASURING AMBIENT TEMPERATURE

(71) Applicant: SENSIRION AG, Stäfa (CH)

(72) Inventors: Matthias Merz, Stäfa (CH); Manuel Becker, Stäfa (CH)

(73) Assignee: SENSIRION AG, Stäfa (CH)

( * ) Notice: Subject to any disclaimer, the term of this patent is extended or adjusted under 35 U.S.C. 154(b) by 469 days.

(21) Appl. No.: 17/601,439

(22) PCT Filed: Apr. 6, 2020

(86) PCT No.: PCT/EP2020/059740
§ 371 (c)(1),
(2) Date: Oct. 5, 2021

(87) PCT Pub. No.: WO2020/201574
PCT Pub. Date: Oct. 8, 2020

(65) Prior Publication Data
US 2022/0176780 A1    Jun. 9, 2022

(30) Foreign Application Priority Data

Apr. 5, 2019   (DE) ............... 20 2019 101 992.1

(51) Int. Cl.
*G01K 13/024*   (2021.01)
*B60H 1/00*   (2006.01)
(Continued)

(52) U.S. Cl.
CPC ....... *B60H 1/00792* (2013.01); *G01D 11/245* (2013.01); *G01K 1/08* (2013.01);
(Continued)

(58) Field of Classification Search
None
See application file for complete search history.

(56) References Cited

U.S. PATENT DOCUMENTS

2009/0056417 A1*  3/2009  Kilps ................ G01N 1/2205
                                                              73/28.04
2010/0331941 A1   12/2010  Walsh
(Continued)

FOREIGN PATENT DOCUMENTS

CN       101796388       8/2010
DE     102008002546     12/2009
(Continued)

*Primary Examiner* — Erica S Lin
(74) *Attorney, Agent, or Firm* — JMB Davis Ben-David

(57) ABSTRACT

The invention relates to a sensor module (1) for measuring at least one measurand, comprising: a housing (2) having a flow duct (23) with an air inlet (21) and an air outlet (22), the housing (2) enclosing an interior (20) of the housing (2); a circuit board (4) arranged in the interior (20); at least one sensor (3) which is arranged on the circuit board (4) and is designed to measure at least one measurand of an air flow (L) conducted past the sensor (3); a terminal (5) arranged on the circuit board (4) for making electrical contact with the sensor module (1); and a fan (6), which has a motor (60) and a rotor (61) which can be rotated about an axis of rotation (z) by means of the motor (60), the motor (60) being electrically conductively connected to the circuit board (4), and the fan (6) being designed to generate an air flow (L) in the flow duct (23) between the air inlet (21) and the air outlet (22) such that the air flow (L) flows past the sensor (3) and, in the region of the air inlet (21), flows in a flow direction (x) which runs at an angle (V) in the range of 45° to 90° to the axis of rotation (z).

14 Claims, 18 Drawing Sheets

Figure 1:
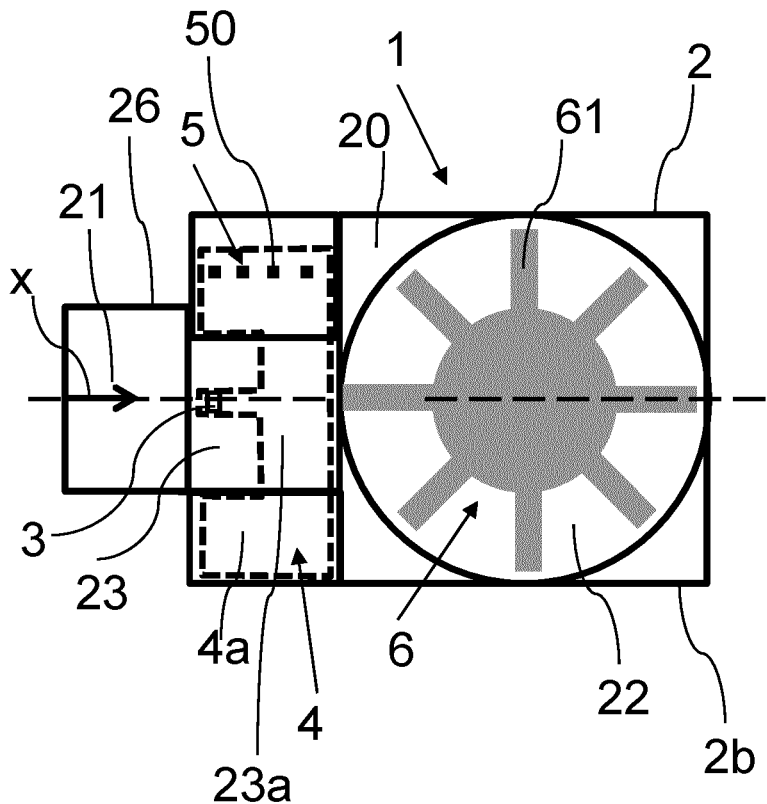

(51) Int. Cl.
    *G01D 11/24*     (2006.01)
    *G01K 1/08*     (2021.01)
    *G01N 1/22*     (2006.01)
    *H05K 1/18*     (2006.01)
    *H05K 7/14*     (2006.01)
    *G01N 1/24*     (2006.01)

(52) U.S. Cl.
    CPC ......... *G01K 13/024* (2021.01); *G01N 1/2273* (2013.01); *H05K 1/181* (2013.01); *H05K 7/1427* (2013.01); *G01K 2201/02* (2013.01); *G01N 2001/245* (2013.01); *H05K 2201/10151* (2013.01); *H05K 2201/10189* (2013.01)

(56) References Cited

U.S. PATENT DOCUMENTS

2011/0114384 A1\*   5/2011   Sakamoto .......... H05K 7/20972
                                                                                 174/547
2014/0211487 A1\*   7/2014   Spiro ...................... F21V 29/74
                                                                                 362/382

FOREIGN PATENT DOCUMENTS

| DE | 102010030769 | 1/2012 |
|----|--------------|--------|
| FR | 2943416 | 9/2010 |
| WO | 2007070931 | 6/2007 |
| WO | 2009153094 | 12/2009 |

\* cited by examiner

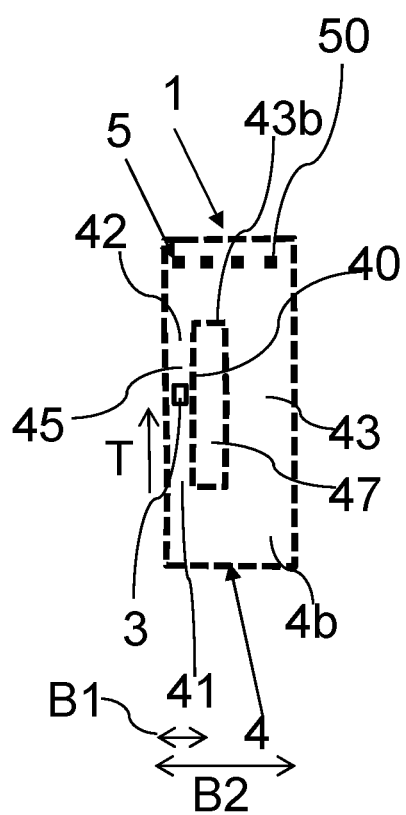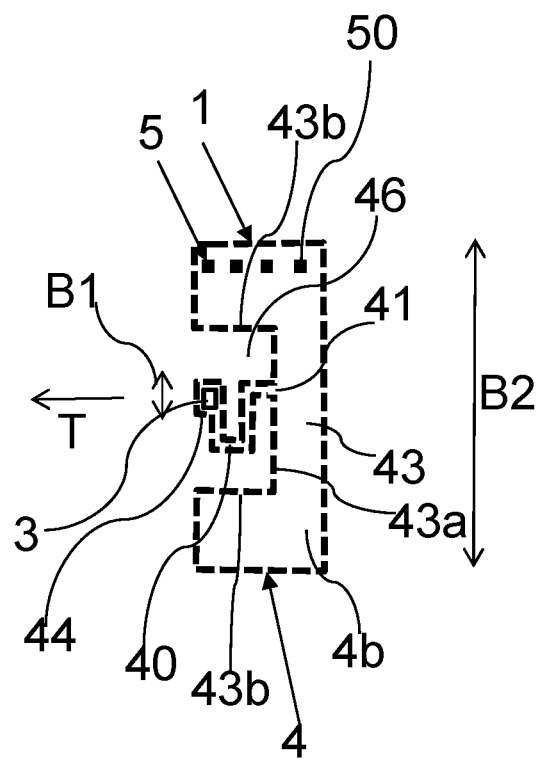

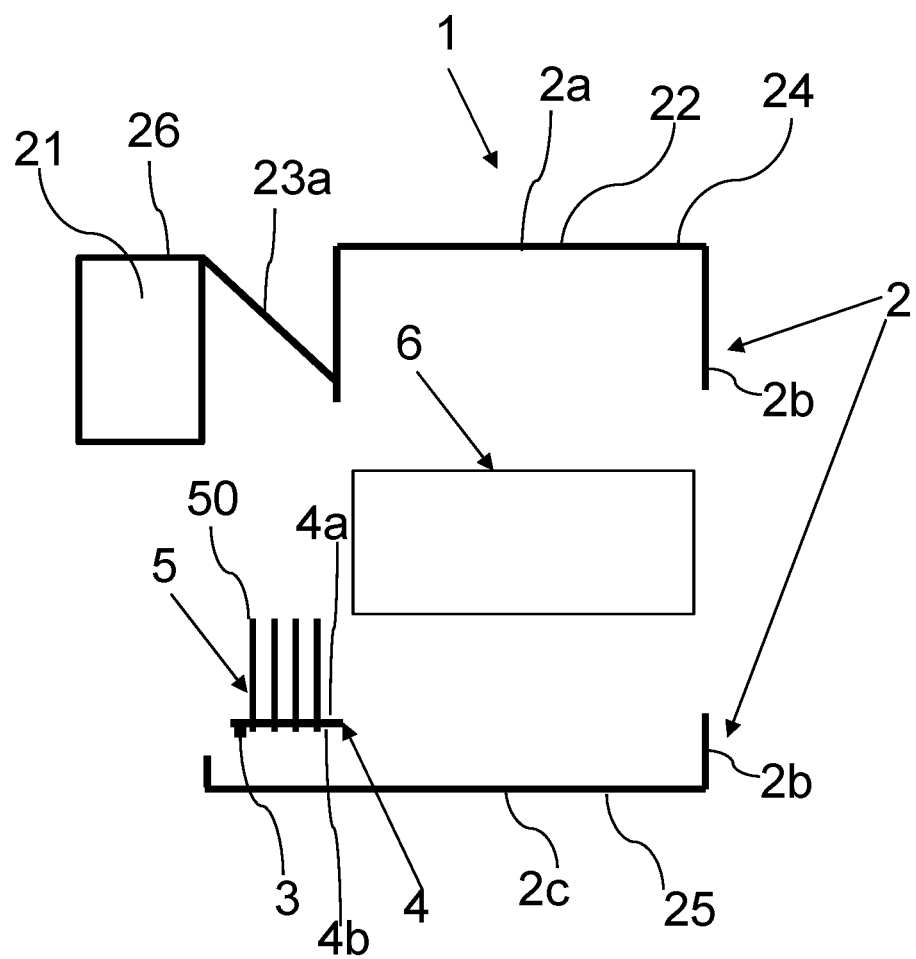

SENSOR MODULE, PARTICULARLY FOR MEASURING AMBIENT TEMPERATURE

CROSS-REFERENCE TO RELATED APPLICATION

This is the U.S. National Stage of International Patent Application No. PCT/EP2020/059740 filed Apr. 6, 2020, and which in turn claims the benefit of German Patent Application No. 202019101992.1 filed Apr. 5, 2019.

DESCRIPTION

The present invention relates to a sensor module for measuring a measurand, in particular an ambient temperature.

Such sensors can be used, for example, in a vehicle to measure the temperature in a passenger compartment.

Often, in such sensors, fans are provided which generate an air flow which is fed to a sensor of the sensor module, the sensor being arranged upstream of the fan coaxially with the axis of rotation of the fan and being connected to a printed circuit board via a cable connection or rigid solder connections. The air flow is generally drawn in axially, i.e., in the direction of the axis of rotation, and is output in the radial direction of the rotor of the fan.

DE 100 21 067 A1 describes an electric motor-driven fan for ventilating a sensor, for example in the form of a temperature sensor, the sensor being arranged at or in the inlet of the fan housing. In this case, the sensor is held by means of a support rod and is positioned coaxially with the axis of rotation of the fan.

Based on this, the present invention is based on the problem of creating a sensor module that can be manufactured efficiently and has a sufficiently simple and small design.

This problem is solved by a sensor module having the features of claim 1.

Preferred embodiments of the sensor module are disclosed in the corresponding sub claims and are described below.

According to claim 1, a sensor module for measuring at least one measurand is disclosed, comprising:
- a housing comprising a flow channel with an air inlet and an air outlet, the housing surrounding an interior space of the housing,
- a printed circuit board arranged in the interior space,
- at least one sensor which is arranged on the printed circuit board and is designed to measure at least one measurand of an air flow which is guided past the sensor,
- a terminal arranged on the printed circuit board for electrically contacting the sensor module, and
- a fan which comprises a motor and a rotor which can be rotated about an axis of rotation by means of the motor, the motor being electrically conductively connected to the printed circuit board, and the fan being designed to generate an air flow in the flow channel between the air inlet and the air outlet, so that the air flow flows past the sensor and flows upstream of the sensor in the region of the air inlet along a flow direction which runs at an angle to the axis of rotation which is in the range from 45° to 90°.

According to an embodiment of the sensor module, the sensor is arranged upstream of the fan with respect to the flow direction. Such an arrangement of the sensor in the intake area of the fan is advantageous, since the ambient air or the air flow to be measured is not heated by the fan, which leads to more accurate measurement results.

Furthermore, according to an embodiment of the sensor module, it is provided that said angle is in the range of 60° to 90°, in particular in the range of 75° to 90°, in particular in the range of 80° to 90°. Preferably, said angle is 90°, meaning that the air flow in the region of the air inlet flows along a flow direction which is perpendicular to the axis of rotation.

Furthermore, according to an embodiment of the invention, the at least one measurand is one of the following measurands: a temperature of the air flow passing the sensor, a relative humidity of the air flow passing the sensor, a gas concentration of the air flow passing the sensor.

According to one embodiment, it is further provided that the sensor may measure more than one measurand. For example, the sensor may be configured to measure the temperature and/or the relative humidity and/or a gas concentration of an air flow passing the sensor.

Where the sensor is adapted to measure a gas concentration, the sensor may be or comprise a gas sensor. The gas sensor may be, for example, a MOX gas sensor, e.g. according to EP2765410, or an optical gas sensor, e.g., according to EP3144663, or an electrochemical gas sensor, e.g., according to EP2896962.

According to one embodiment, the sensor or gas sensor is particularly configured to measure a $CO_2$ concentration and/or a concentration of at least one volatile organic compound.

The sensor or gas sensor may comprise a gas sensor chip. The gas sensor chip may comprise a semiconductor substrate, for example out of silicon, in which semiconductor substrate a circuit may be integrated. Various layers, for example CMOS layers, may be provided to form the circuit.

Preferably, the sensor and the terminal are arranged on the printed circuit board, so that a particularly compact design of the sensor module is possible. In this case, the fan can be connected to the printed circuit board via a cable (e.g., via a further terminal arranged on the printed circuit board, which can be connected to the cable). In particular, the terminal may be implemented by a plug connection, a solder connection or another suitable electrically conductive connection. Alternatively, the fan may also be arranged on the printed circuit board.

The terminal is preferably designed for making electrical contact with the sensor and/or for supplying the sensor module with an operating voltage (in particular for the motor and the sensor). Furthermore, an output signal of the sensor is preferably present at the terminal, so that the measured temperature (or the relative humidity or the gas concentration) can be read out via the terminal.

The sensor and/or the connection and/or the fan can be designed as an SMD or can be connected to the printed circuit board by means of THT or by means of a press connection. According to an embodiment, a connector (SMD) is provided for contacting the fan on the printed circuit board, which connector accommodates a counterpart which is arranged on the cable of the fan. However, the fan can also be connected to the printed circuit board by a soldered connection or another electrically conductive connection.

SMD stands for surface-mounted device, i.e., a component that, in contrast to THT (Through Hole Technology), does not have any wire connections but can be soldered directly onto the PCB by means of solderable connection pads (SMT for surface-mounting technology). With THT, on the other hand, the respective component comprises connecting wires, wherein the respective connecting wire is inserted through an assigned hole in the PCB and soldered to the PCB.

The respective component (sensor and/or terminal and/or fan) is preferably soldered to the printed circuit board by means of reflow soldering or wave soldering.

According to a particularly preferred embodiment, the sensor is an SMD, i.e., surface mount device (see above).

Preferably, according to an embodiment, for electrically connecting the sensor and/or the terminal and/or the fan to the printed circuit board, no flexible wire connections are provided in addition to the printed circuit board.

Furthermore, according to an embodiment of the sensor module according to the invention, it is provided that the printed circuit board comprises a carrier portion on which the sensor is arranged, the carrier portion being connected to a base portion of the printed circuit board via at least a first connecting region of the carrier portion. Preferably, the carrier portion is integrally connected to or integrally formed with the base portion via said first connecting region. Furthermore, according to an embodiment, it is preferably provided that the carrier portion or the first connecting region comprises a width perpendicular to a direction in which the carrier portion protrudes from the base portion that is smaller than the width of the base portion perpendicular to said direction. In this regard, the direction under consideration preferably extends parallel to a top side or a bottom side of the printed circuit board facing away from the top side. Normal to the bottom side or top side, the printed circuit board has its smallest extension. This corresponds to the thickness of the printed circuit board.

Furthermore, according to a preferred embodiment of the invention, it is provided that the carrier portion protrudes into the flow channel so that the sensor is arranged in the flow channel.

Therefore, according to an embodiment, the carrier portion is preferably longitudinally elongated.

Furthermore, according to a preferred embodiment of the sensor module according to the invention, it is provided that the carrier portion comprises an end region opposite the first connecting region of the support section, on which the sensor is arranged.

According to one embodiment, in this regard, it is provided that the end region of the carrier portion projects beyond the entire base portion in said direction (in which the carrier portion projects from the base portion) and/or projects into the air inlet.

Further, according to one embodiment, the carrier portion, in a recess of the base portion, projects from the base portion in said direction.

Preferably, the recess is bounded by a middle edge of the base portion and by two opposite lateral edges of the base portion which are connected to each other via the middle edge. The middle edge may be arranged at right angles to the two lateral edges. However, other edge courses are also possible, in particular rounded transitions between the edges.

According to an embodiment of the invention, it is provided that the carrier portion protrudes from the middle edge of the base portion.

According to an alternative embodiment of the invention, in contrast, it is provided that the carrier portion protrudes from one of the lateral edges, and in particular in such a way that the base portion and the carrier portion together delimit an L-shaped recess or L-shaped cutout of the printed circuit board.

Furthermore, according to an embodiment of the invention, it is provided that the support section has a meandering course.

However, embodiments of the carrier portion are also conceivable in which the carrier portion does not comprise a free end region but, in addition to the first connecting region, is connected to the base portion via a second connecting region, so that the carrier portion and the base portion together delimit an, for example, rectangular through-opening of the printed circuit board.

In such a case, it is preferably provided, according to an embodiment of the invention, that the sensor is arranged on a central region of the carrier portion which is arranged between the first and the second connection region of the carrier and connects the first and the second connecting region of the carrier portion to each other. Also, in this way, the sensor can be advantageously placed in the flow channel and flowed around by the generated air flow.

Furthermore, according to an embodiment of the sensor module according to the invention, it is provided that the housing comprises a housing top and a housing bottom opposite the housing top, wherein the housing top and the housing bottom are connected to each other via a side wall of the housing.

According to one embodiment, the housing comprises, for example, a housing upper part and a housing lower part connected thereto, wherein the housing upper part comprises the housing top, and wherein the housing lower part comprises the housing bottom, and wherein the side wall is preferably formed by the housing upper part and/or the housing lower part.

Furthermore, according to one embodiment of the invention, it is provided that the air inlet to the flow channel is formed in the side wall of the housing.

Preferably, according to an embodiment, it is provided that the air inlet is formed by a nozzle projecting from the side wall. The nozzle can be at least partially cylindrical.

Furthermore, according to an embodiment of the invention, it is provided that the printed circuit board has a top side and a bottom side facing away from the top side.

According to an embodiment, in this respect, it is provided that the flow channel is delimited by a wall portion facing the top side of the printed circuit board and sloping towards the top side of the printed circuit board, i.e., it is inclined to the top side or forms an acute angle with it.

Furthermore, according to an embodiment of the invention, it is provided that the printed circuit board (in particular the base portion) partially extends below the fan, and in particular below the rotor, so that a portion of the printed circuit board faces the fan, in particular the rotor, in a direction parallel to the axis of rotation.

Furthermore, according to an embodiment of the invention, it is provided that the housing of the sensor module extends along a central axis, the air inlet or the nozzle being arranged offset with respect to the central axis in a direction perpendicular to the axis of rotation. In this case, therefore, there is in particular an asymmetrical (i.e., non-coaxial) arrangement of the nozzle with respect to the central axis of the housing.

Furthermore, according to an embodiment of the invention, it is provided that the printed circuit board and/or said direction along which the carrier portion protrudes from the base portion of the printed circuit board extends perpendicularly to the axis of rotation.

In particular, it is provided that the top side of the printed circuit board faces the housing top.

As an alternative to the above orientation of the axis of rotation, it may be provided that the printed circuit board and/or said direction along which the carrier portion protrudes from the base portion of the printed circuit board extends parallel to the axis of rotation.

In this case, preferably the top side of the printed circuit board faces the fan or the side wall of the housing.

Further, according to an embodiment of the invention, the fan is a radial fan, wherein the rotor is configured to draw in the air flow in the direction of the axis of rotation and discharge the air flow in the radial direction of the rotor.

In accordance with an alternative embodiment of the invention, in contrast, it is provided that the fan is an axial fan, the rotor being configured to draw in the air flow in the direction of the axis of rotation and to discharge it in the same direction.

Particularly preferably, according to an embodiment, the fan is arranged on the printed circuit board, and preferably on said base portion of the printed circuit board.

According to an embodiment, the motor of the fan comprises a coil which is preferably arranged on the printed circuit board, in particular on the base portion. Furthermore, according to an embodiment, the motor of the fan comprises a magnet arranged on the rotor.

According to a further embodiment, it is provided that the motor comprises a shaft extending along the axis of rotation and supported by means of a bearing, the bearing preferably being held by means of a bearing support projecting from or fixed to the housing bottom. Preferably, the bearing support is integrally formed with the housing bottom, e.g., formed therewith in one piece.

According to a further embodiment of the sensor module according to the invention, it is provided that at least one further electronic component is arranged on the printed circuit board.

The further electronic component may be one of the following components: a microcontroller, a LIN interface, a power controller, a device for protection against an electrostatic discharge.

A Local Interconnect Network (LIN for short) is a serial communication system for networking e.g., sensors, especially according to the ISO 17987-1 standard.

Furthermore, according to an embodiment of the invention, the sensor may also be configured to measure relative humidity (RH), for example according to DE20201105119. Preferably, the sensor is configured to measure the temperature and the relative humidity of the air flow passing the sensor.

According to a further embodiment of the invention, the further electronic component may also be a further sensor.

The further sensor may, for example, be a gas sensor, which may be designed in the manner already set out above.

According to an embodiment of the invention, it is provided that the at least one further electronic component is arranged on the bottom side of the printed circuit board.

In this regard, it may further be provided according to an embodiment that the sensor is arranged on the bottom side of the printed circuit board. This enables simple assembly of the printed circuit board and soldering of the components to the printed circuit board.

According to an alternative embodiment of the invention, it is provided that the sensor is arranged on the top side of the printed circuit board. This may ensure a better incident flow to the sensor.

Furthermore, according to an embodiment of the sensor module according to the invention, it is provided that the terminal is in the form of a plug connector.

Preferably, the terminal or connector is located on the top side of the printed circuit board.

According to an embodiment of the invention, it is provided that the connector comprises a plurality of electrically conductive (in particular parallel) contact pins for electrically contacting the sensor module.

According to an embodiment, the contact pins protrude from the top side of the printed circuit board perpendicular to the printed circuit board.

For establishing an electrical connection with the contact pins of the terminal or connector, according to an embodiment of the invention, it is provided that the housing forms a guide for the connector, the guide preferably surrounding the contact pins and being designed to receive a plug contacting the contact pins.

According to an embodiment of the invention, it is provided that the guide is formed in the lower housing part or in the upper housing part.

Furthermore, according to a preferred embodiment of the invention, it is provided that the sensor module comprises a further terminal arranged on the printed circuit board, via which the fan is electrically conductively connected to the printed circuit board. Preferably, the further terminal is in the form of a plug connector.

Preferably, the further terminal for the fan or the plug-in connection is arranged on the top side of the printed circuit board.

According to one embodiment of the invention, it is provided that the connector for the fan comprises a plurality of electrically conductive (in particular parallel) contact pins for electrically contacting the sensor module. According to one embodiment, these contact pins in turn project perpendicularly to the printed circuit board from the upper side of the printed circuit board.

For establishing an electrical connection with the contact pins of the further terminal or the connector for the fan, it is provided according to one embodiment of the invention that the further terminal comprises a guide, the guide preferably surrounding the contact pins and being designed to receive a plug contacting the contact pins, the plug being suitably electrically connected to the fan, for example by means of a flexible line.

Furthermore, according to an embodiment of the invention, it is provided that the flow channel extends to a bottom side of the rotor facing the housing bottom, so that the air flow is sucked through the rotor in a direction facing the housing top.

In this respect, it is preferably provided that the air outlet of the sensor module is formed in the housing ceiling or in the side wall of the housing.

As an alternative to the above-mentioned course of the flow channel, it is provided according to an embodiment of the invention that the flow channel extends to a top side of the rotor facing the housing top, so that the air flow through the rotor is sucked in in a direction facing the housing bottom.

In this respect, it is preferably provided that the air outlet is formed in the housing bottom or in the side wall.

Figure 2:
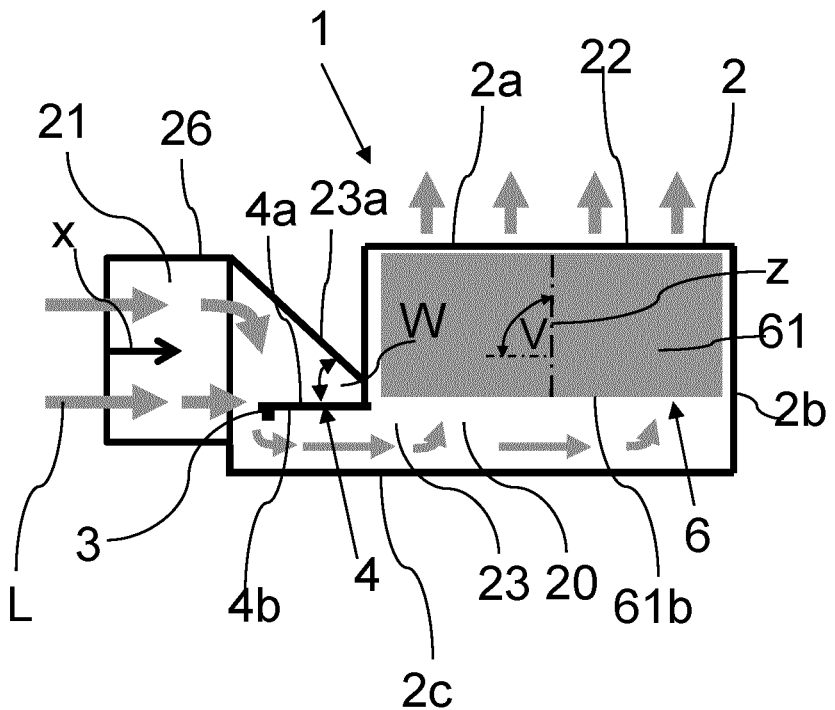
Figure 9:
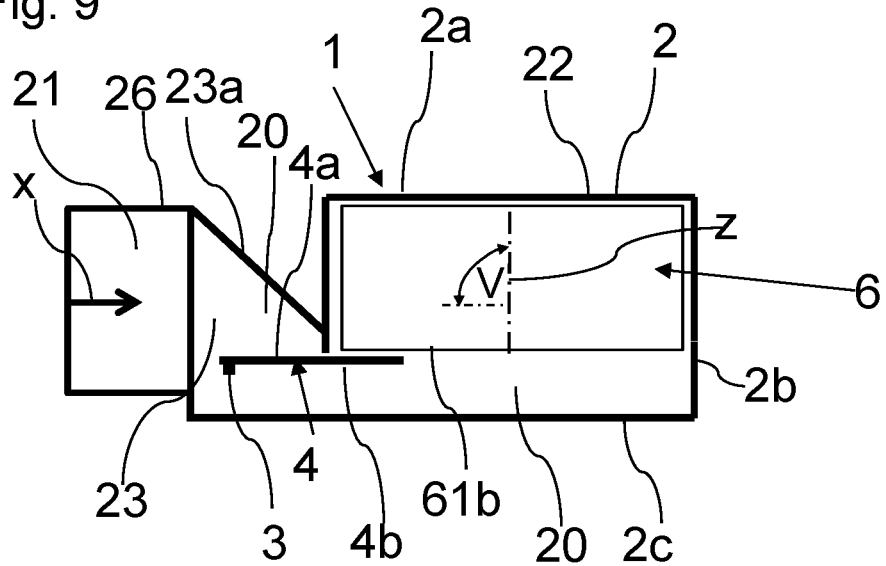
Figure 10:
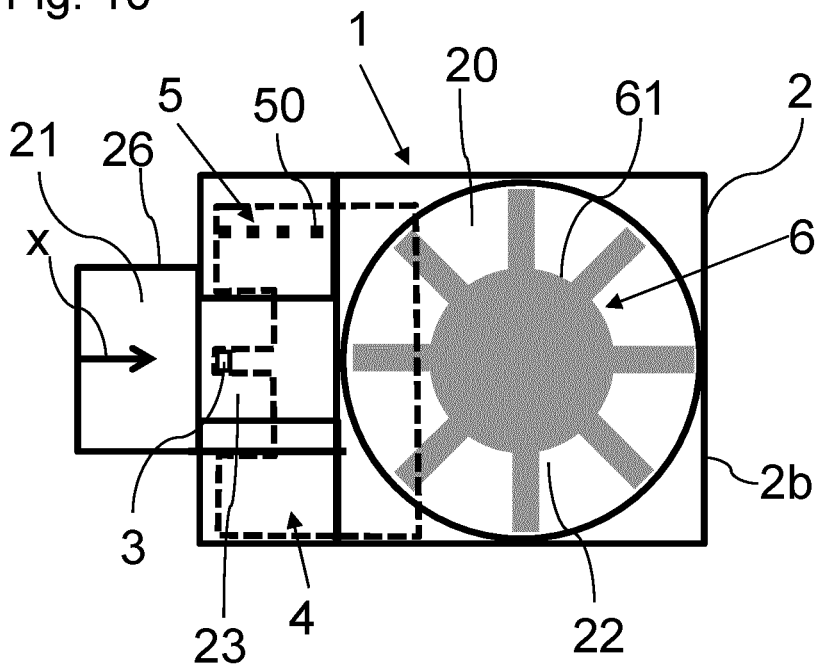
Figure 11:
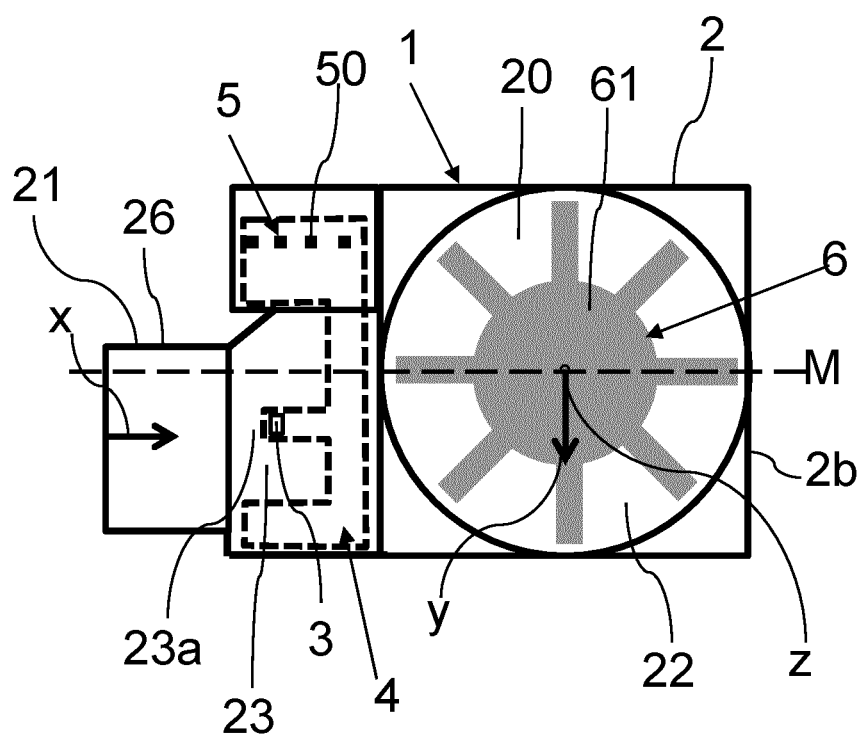
Figure 12:
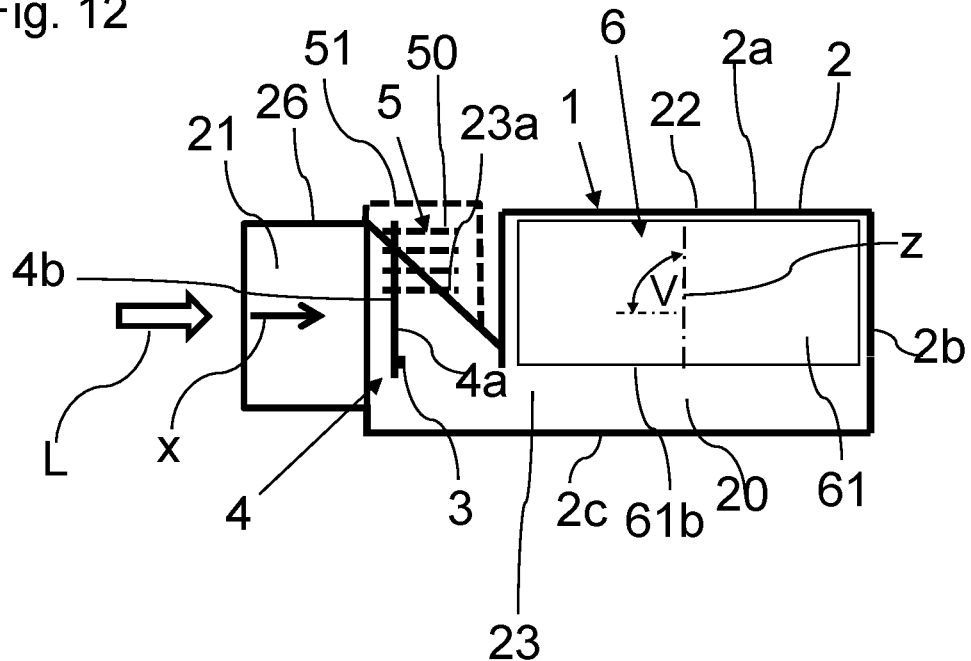
Figure 13:
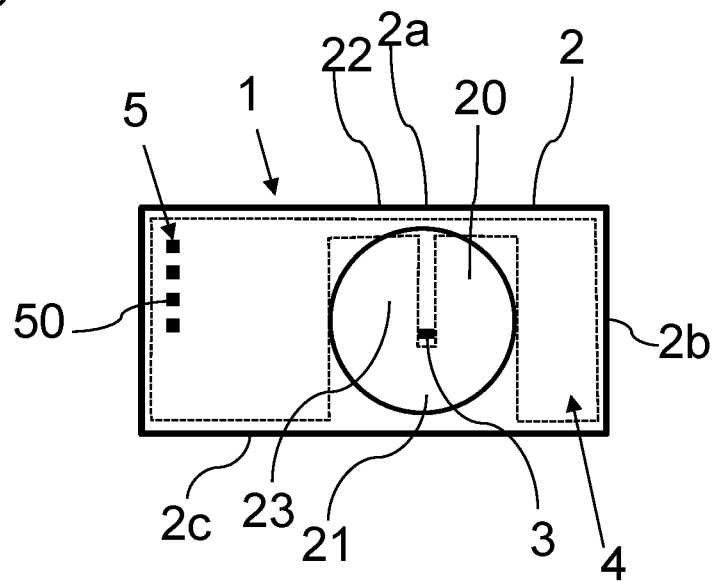
Figure 14:
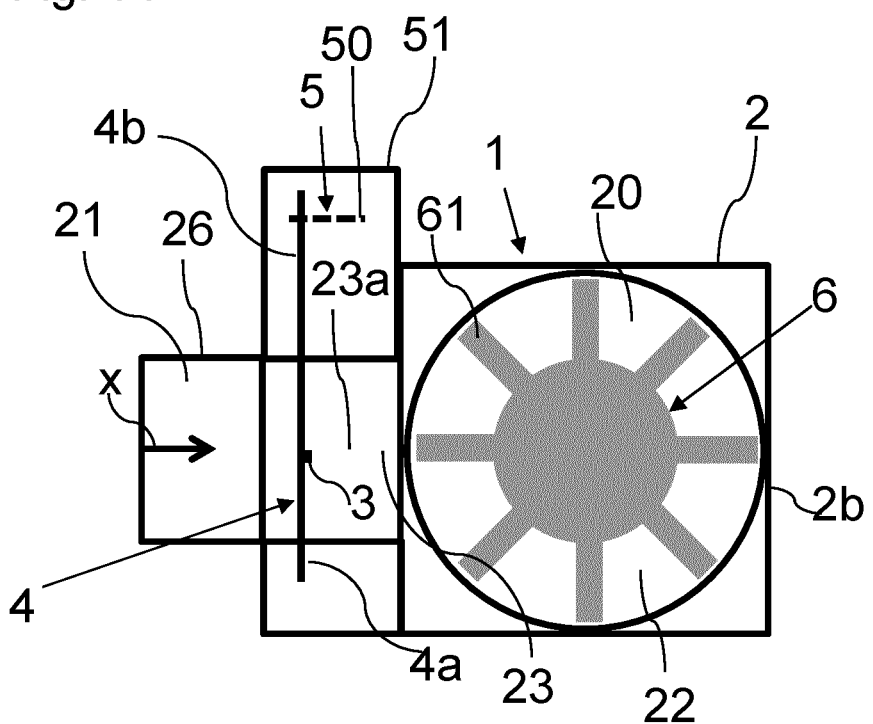
Figure 15:
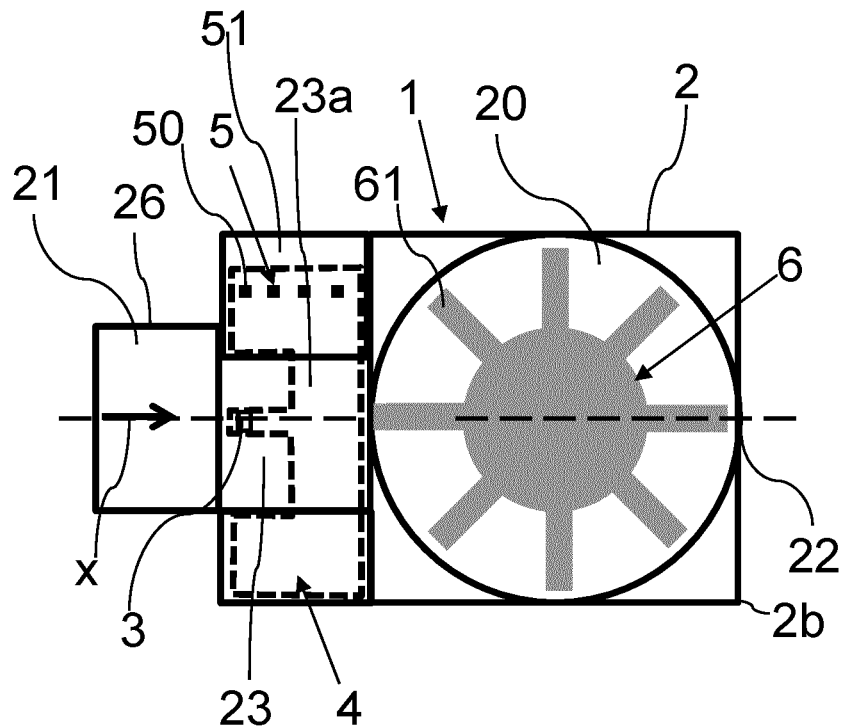
Figure 16:
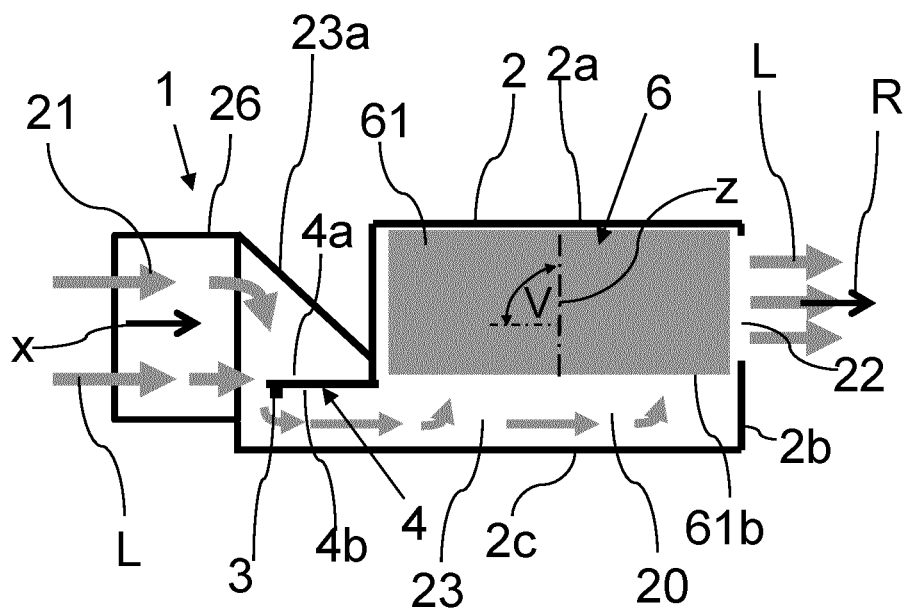
Figure 17:
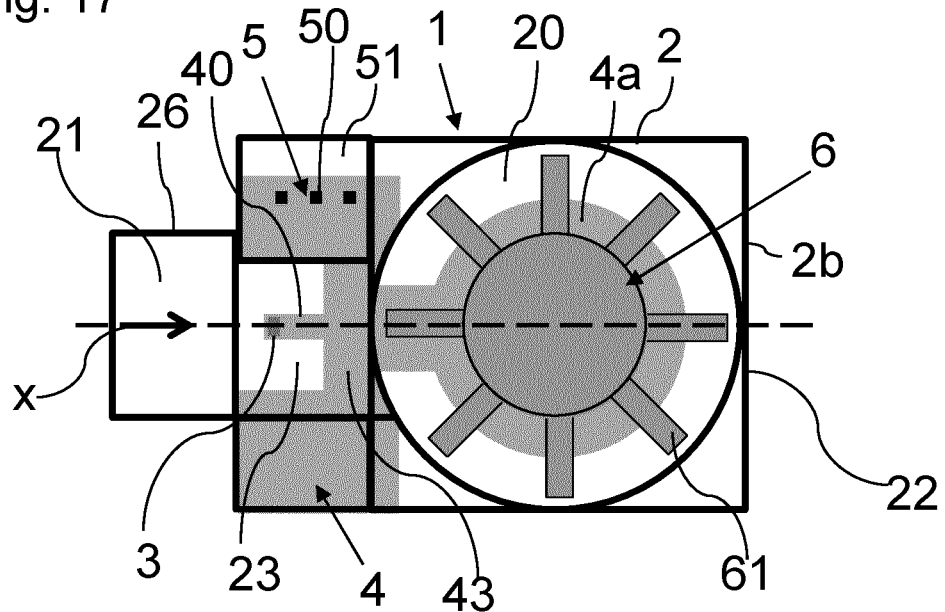
Figure 18:
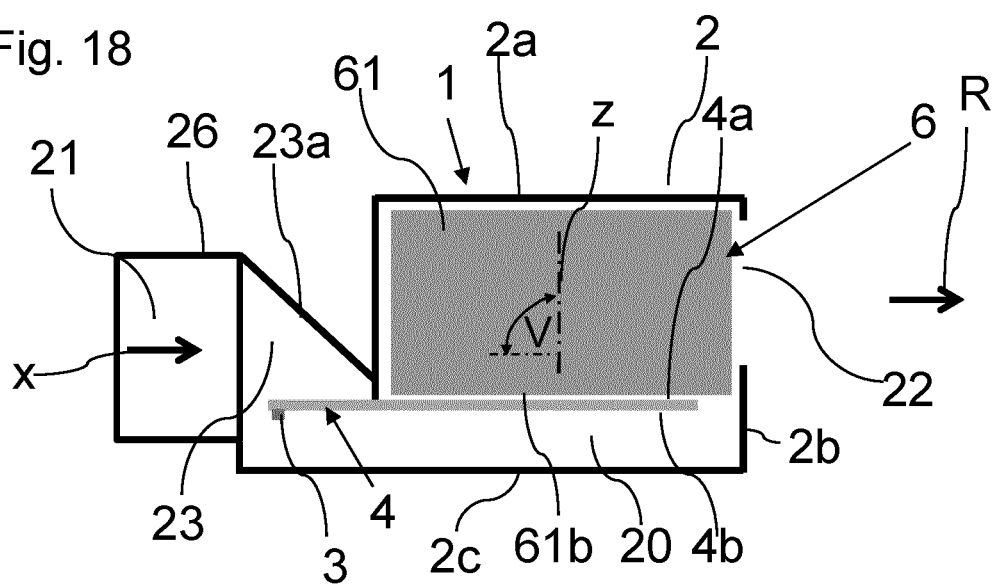
Figure 19:
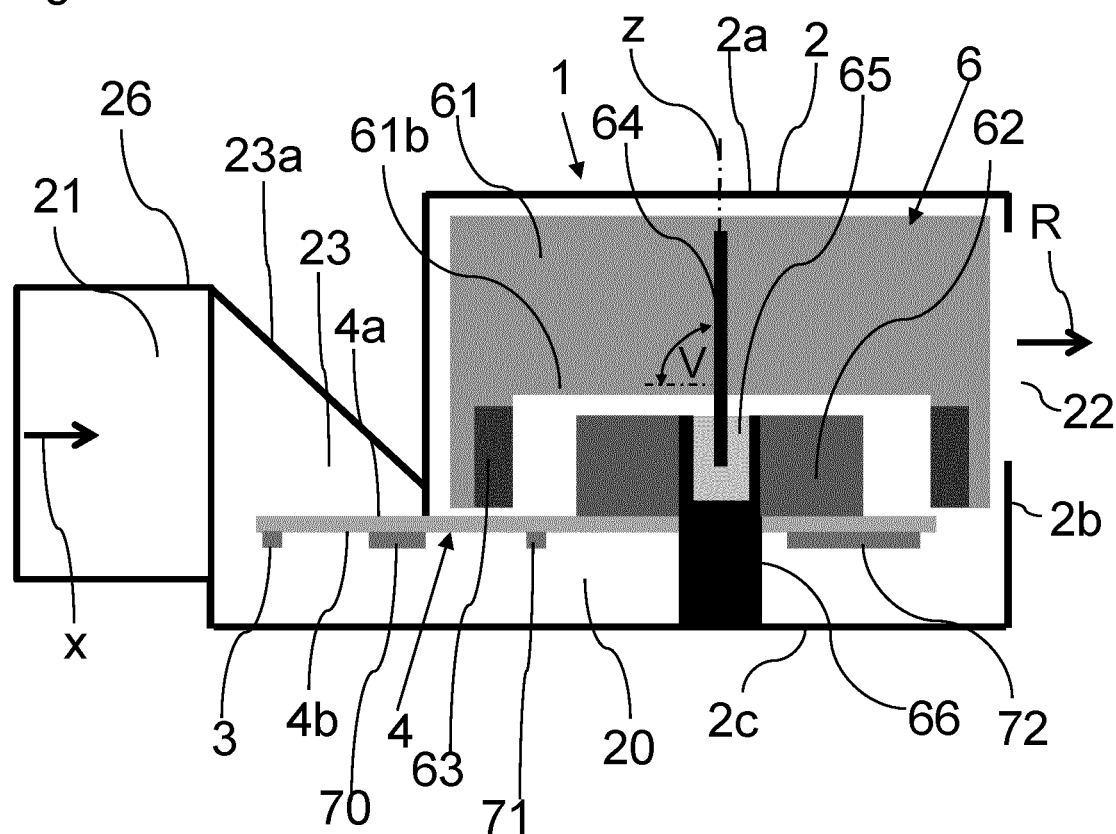
Figure 20:
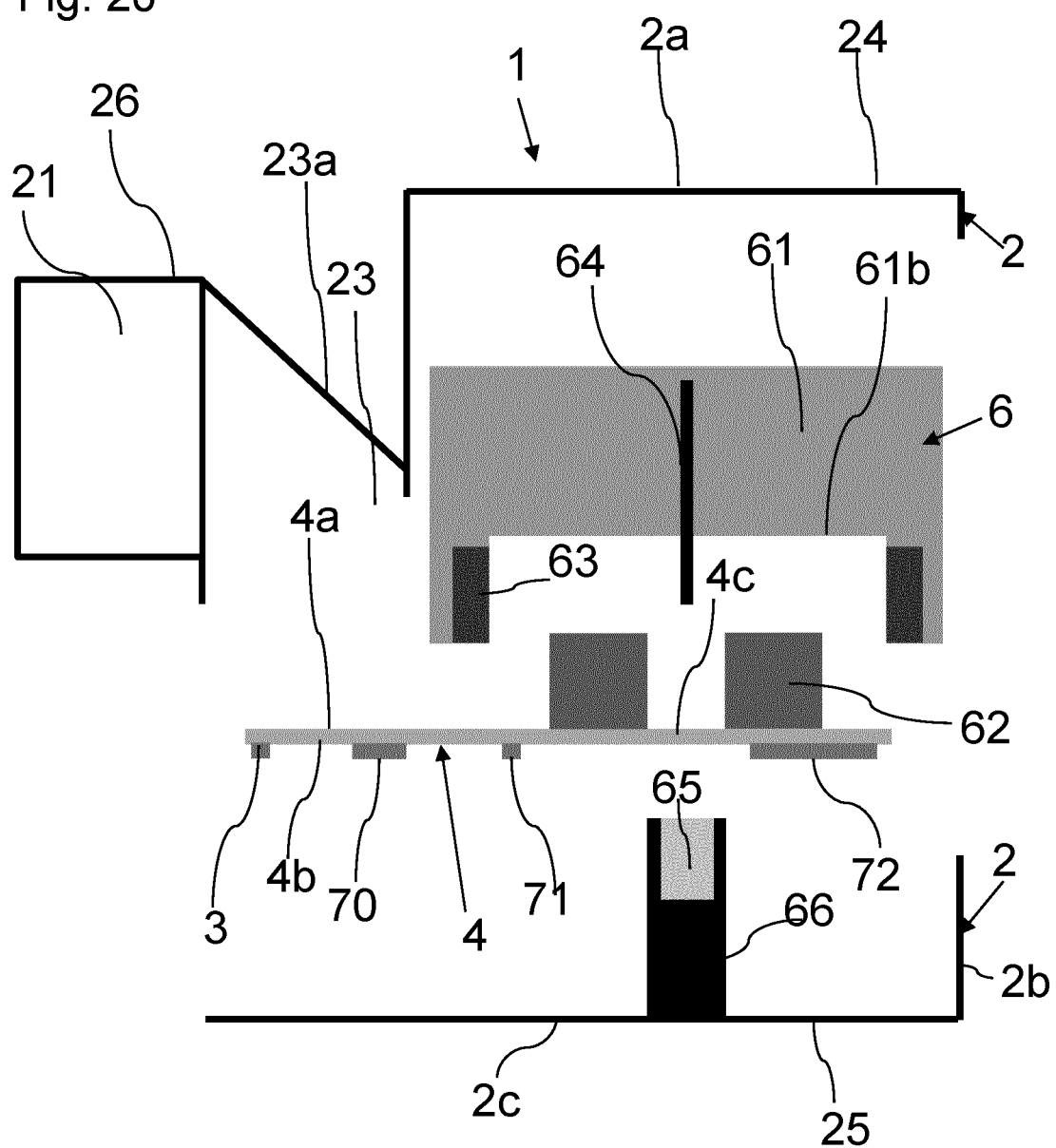
Figure 21:
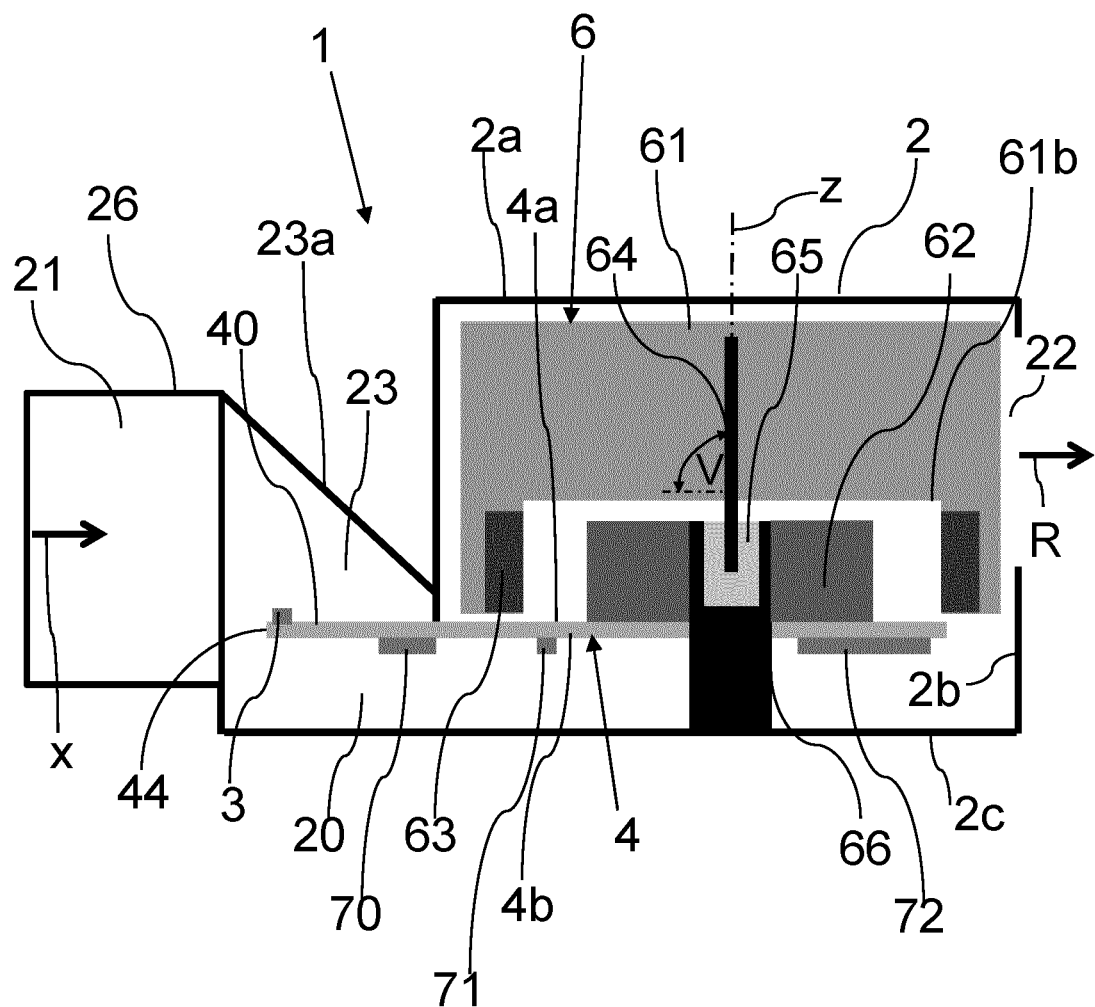
Figure 22:
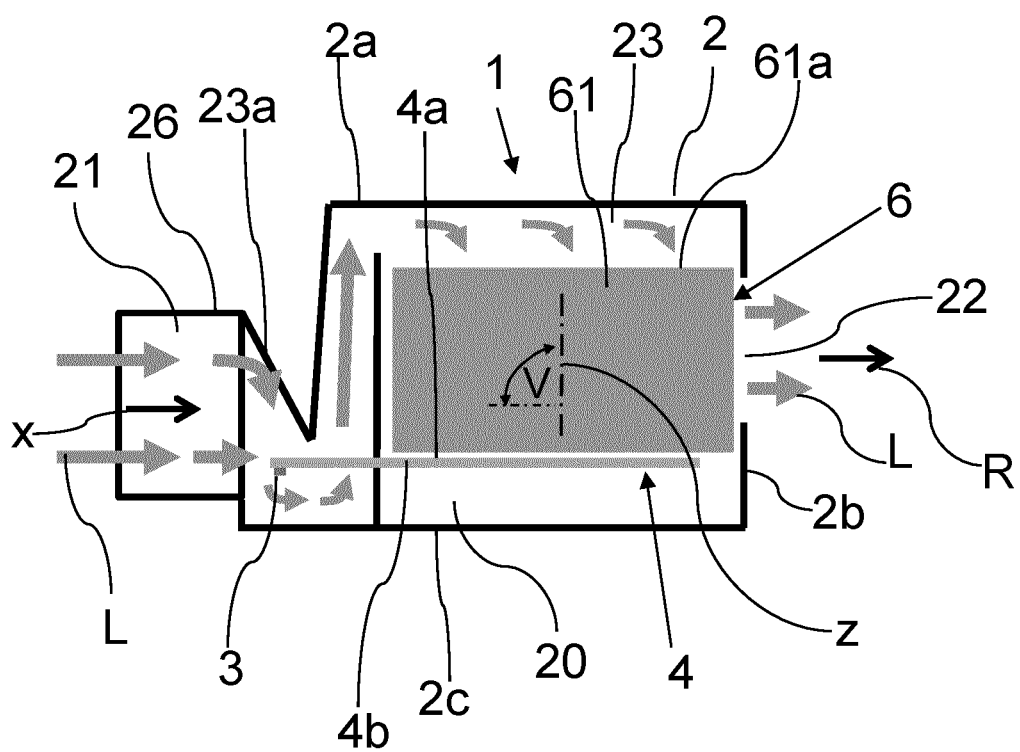
Figure 23:
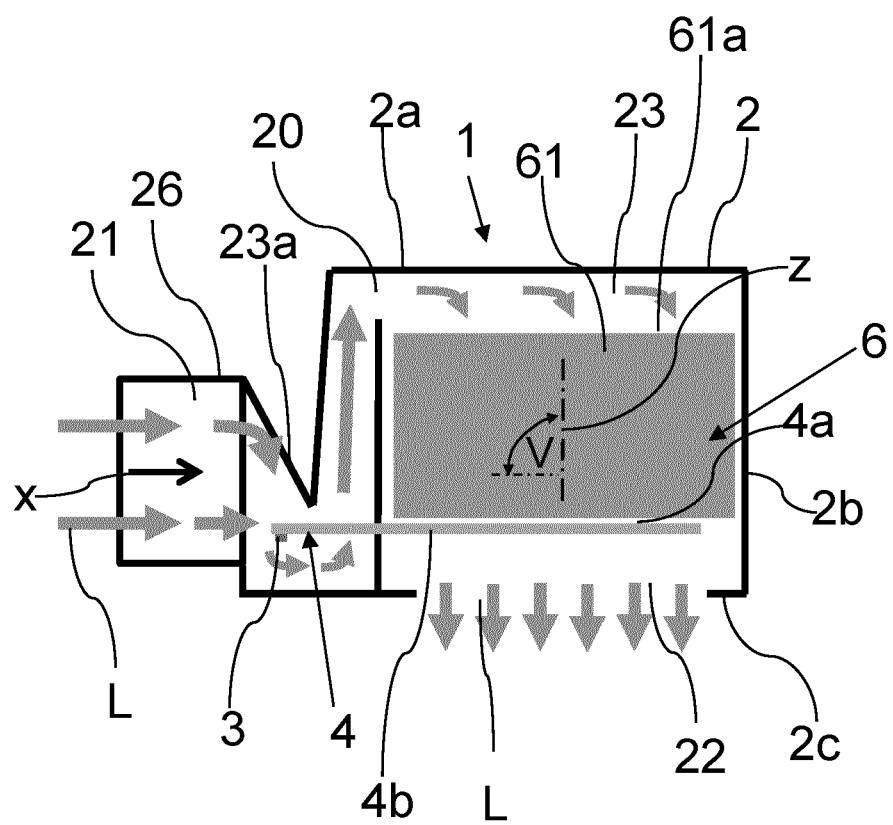
Figure 24:
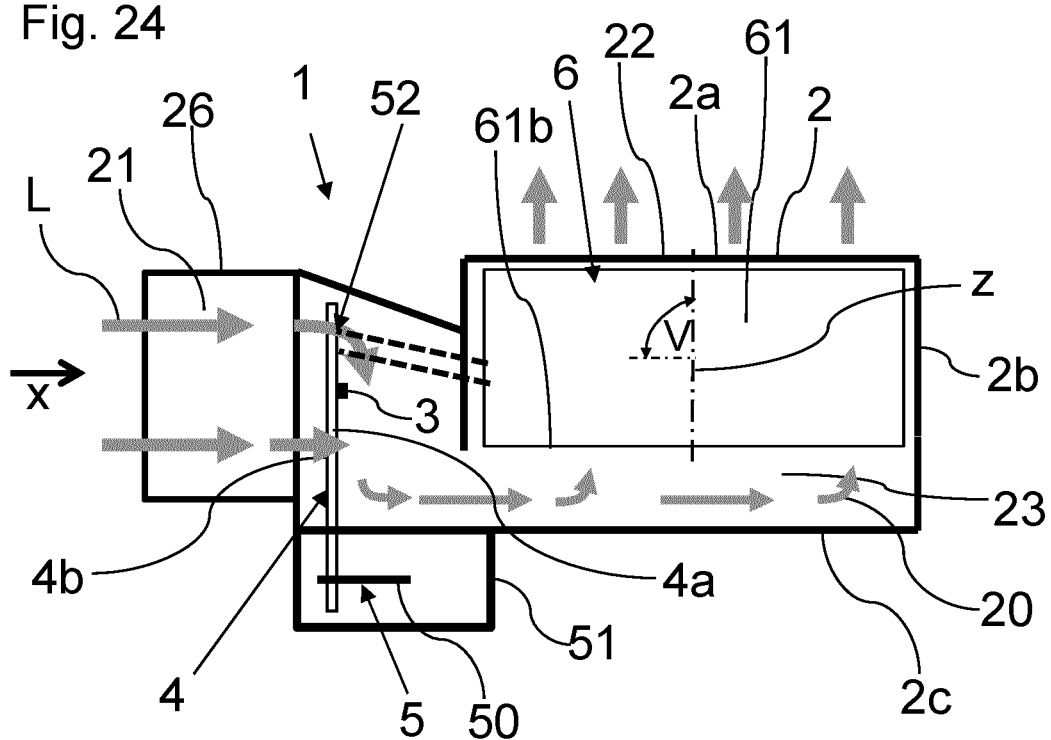
Figure 25:
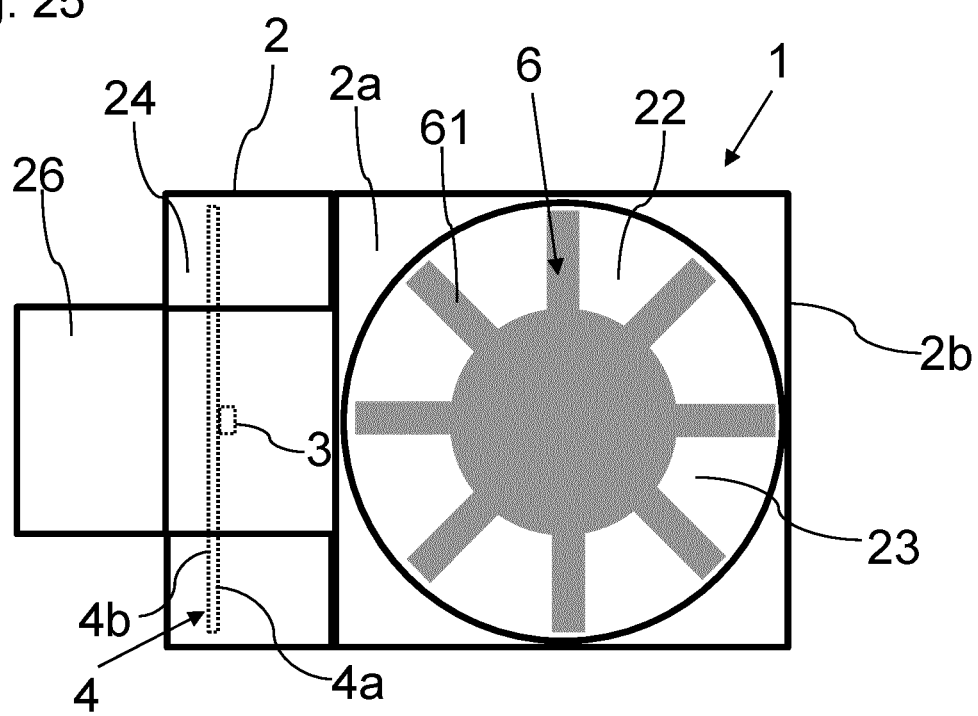
Figure 26:
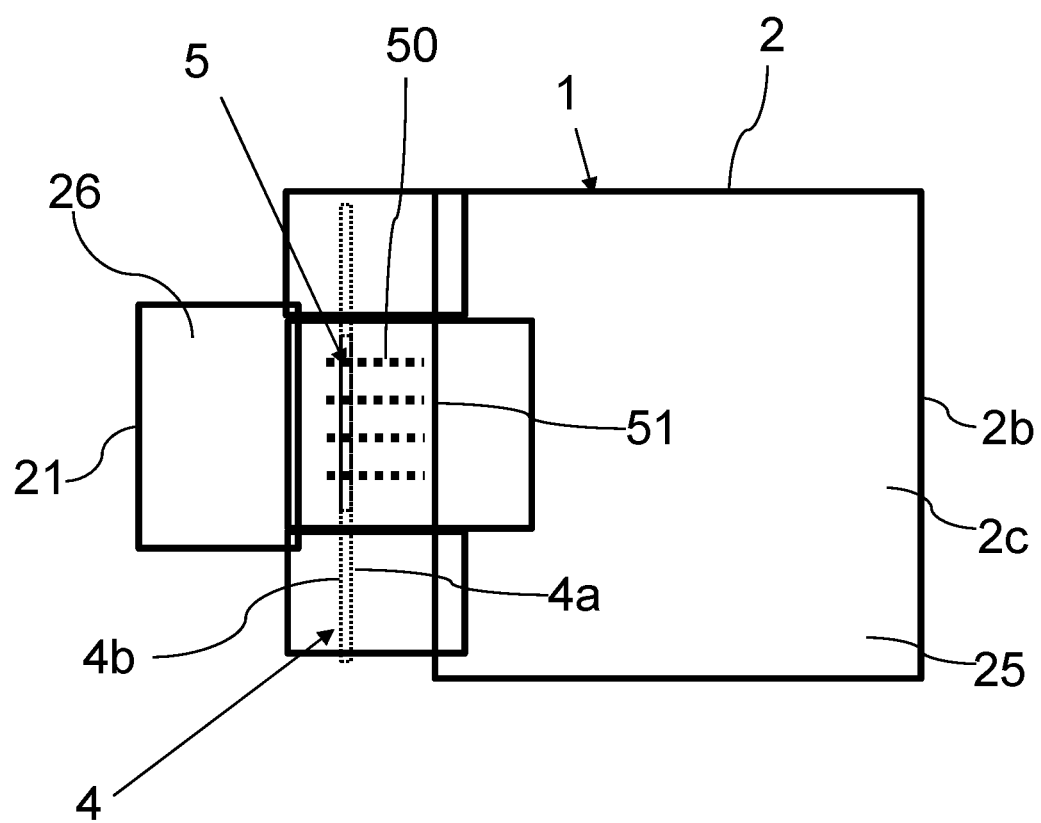
Figure 27:
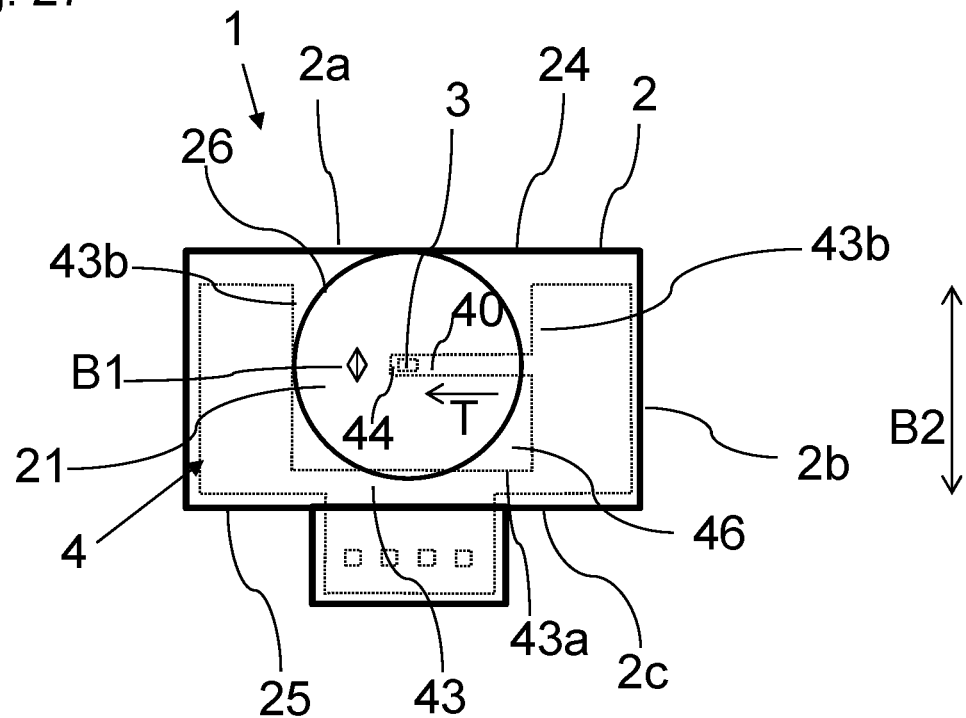

Further features, advantages and embodiments of the present invention will be explained below with reference to the Figures, wherein it is shown in FIG. 1 a schematic top view of an embodiment of a sensor module according to the invention with a fan in the form of an axial fan;

FIG. 2 a schematic cross-sectional view of the sensor module shown in FIG. 1;

FIGS. 3-7 schematic top views of different designs of the printed circuit board of a sensor module according to the invention;

FIG. 8 a schematic exploded view of the sensor module shown in FIGS. 1 and 2;

FIG. 9 a schematic sectional view of a further embodiment of a sensor module according to the invention, wherein the printed circuit board partially extends below the sensor module;

FIG. 10 a schematic top view of the sensor module shown in FIG. 9;

FIG. 11 a schematic top view of a further embodiment of a sensor module according to the invention, wherein here the air inlet or nozzle is arranged asymmetrically with respect to the central axis of the housing of the sensor module;

FIG. 12 a schematic cross-sectional view of a further embodiment of a sensor module according to the invention, in which case the printed circuit board is oriented vertically;

FIG. 13 a schematic top view of the nozzle (air inlet) of the sensor module projecting from the side wall of the housing as shown in FIG. 12;

FIG. 14 a schematic top view of the sensor module shown in FIGS. 12 and 13;

FIG. 15 a schematic top view of a further embodiment of a sensor module according to the invention, wherein here the fan is designed as a radial fan;

FIG. 16 a schematic cross-sectional view of the sensor module shown in FIG. 16;

FIG. 17 a schematic top view of a further embodiment of a sensor module according to the invention, in which case the fan is arranged on a top side of the printed circuit board;

FIG. 18 a schematic cross-sectional view of the sensor module shown in FIG. 18;

FIG. 19 a schematic cross-sectional view of a further embodiment of a sensor module according to the invention, wherein here the rotor of the fan is mounted via a bearing, the bearing support of which is connected to the housing bottom of the housing of the sensor module;

FIG. 20 a schematic exploded view of the sensor module shown in FIG. 19;

FIG. 21 a schematic cross-sectional view of a variation of the sensor module shown in FIG. 20, wherein here the sensor is arranged on a top side of the printed circuit board, in contrast to further electronic components which are arranged on the bottom side of the printed circuit board;

FIG. 22 a schematic cross-sectional view of a further embodiment of a sensor module according to the invention, wherein here the fan is designed as a radial fan and the flow channel is led to a top side of the rotor of the radial fan, wherein the air flow generated by means of the rotor is emitted via an air outlet provided in the side wall of the housing of the sensor module; and FIG. 23 a schematic cross-sectional view of a further embodiment of a sensor module according to the invention, wherein here, in contrast to FIG. 23, the fan is designed as an axial fan, and the air flow generated by means of the rotor is accordingly emitted via an air outlet provided in the housing bottom of the sensor module;

FIG. 24 a cross-sectional view of a further embodiment of a sensor module according to the invention, which is a variation of the embodiment shown in FIG. 12;

FIG. 25 a top view of a housing top of the sensor module according to FIG. 24;

FIG. 26 a top view of a housing bottom of the sensor module according to FIG. 24;

FIG. 27 a view of a front side of the sensor module according to FIG. 24; and

Figure 28:
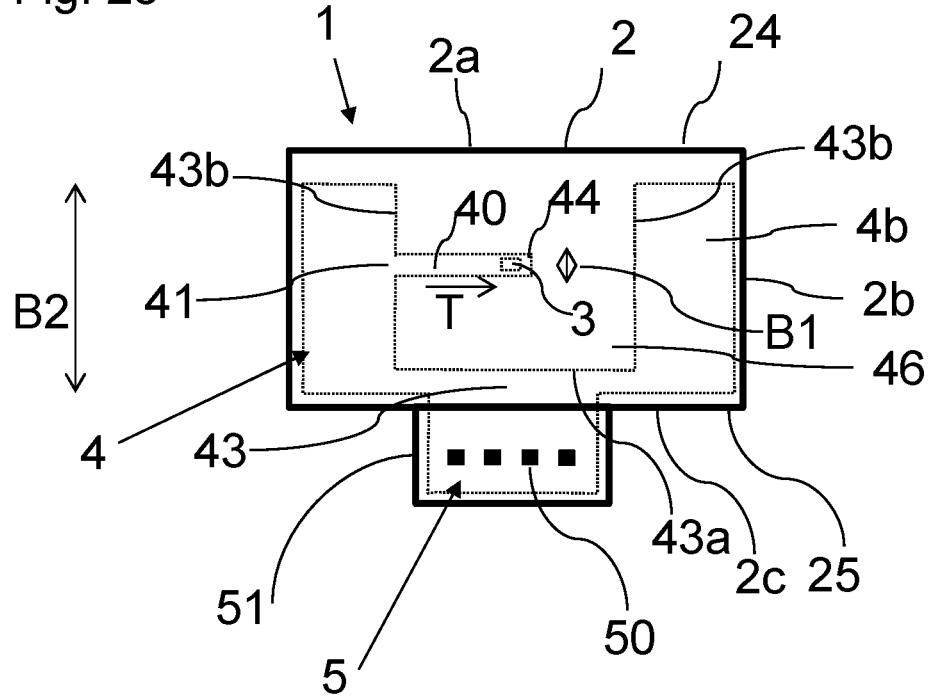

FIG. 28 view of a rear side of the sensor module according to FIG. 24.

FIG. 1 shows in connection with FIG. 2 an embodiment of a sensor module 1 according to the invention for measuring an ambient temperature. The sensor module comprises a housing 2 which forms a flow channel 23 with an air inlet 21 and an air outlet 22 and surrounds an interior space 20 for accommodating components of the sensor module 1. A printed circuit board 4 is arranged in the interior space 20 of the sensor module 1, wherein a sensor 3 is arranged on the printed circuit board 4, which sensor 3 is preferably a surface-mounted device (SMD) (which has no connecting wires passing through the printed circuit board), wherein the sensor 3 is designed to measure, for example, a temperature and/or a relative humidity, and/or a gas concentration of an air flow L passing the sensor 3. Furthermore, a terminal 5 for electrically contacting the sensor module 1 is provided on the printed circuit board 4, the connection being designed in particular for electrically contacting the sensor 3 and/or for supplying the sensor module 1 with an operating voltage (in particular for the motor and the sensor). Furthermore, an output signal of the sensor is preferably present at the connection, so that the measured values (e.g., temperature, relative humidity and/or gas concentration) can be read out via the terminal 5.

Furthermore, the sensor module 1 comprises a fan 6 which comprises a motor 60 and a rotor 61 which can be rotated about an axis of rotation z by means of the motor 60, the motor 60 being electrically conductively connected to the printed circuit board 4, and the fan 6 being designed to suck an air flow L into the flow channel 23 via the air inlet 21 and to discharge it from the housing 2 or the flow channel 23 through the air outlet 22, so that the air flow L flows past the sensor 3 in the housing 2 or in the flow channel 23 and is discharged upstream of the sensor 3 in the air inlet 21 along a direction of flow x the flow channel 23, so that the air flow L flows past the sensor 3 in the housing 2 or in the flow channel 23 and flows upstream of the sensor 3 in the air inlet 21 along a flow direction x which runs in particular perpendicular to the axis of rotation z, i.e., is at an angle V to the axis of rotation z which can be, for example, 90° or can assume the values specified above.

The printed circuit board 4 may comprise etched copper conductive tracks for electrically connecting the individual components arranged on the printed circuit board 4, to which the electronic components are connected, for example by means of SMT or THT.

Preferably, the printed circuit board 4 comprises a carrier portion 40 (cf. also FIGS. 3 to 7) on which the sensor 3 is arranged, the carrier portion 40 being connected to a base portion 43 of the printed circuit board 4 via at least a first connecting region 41 of the carrier portion 40, preferably in one piece, the first connecting region 41 comprising, perpendicular to a direction T in which the carrier portion 40 protrudes from the base portion 43, a width B1 which is smaller than a width B2 of the base portion 43 perpendicular to the same direction T. Said direction T preferably extends parallel to a top side 4a or to a bottom side 4b of the printed circuit board 4 facing away from the top side 4a. Normal to the bottom or top side 4b, 4a, i.e., normal to the drawing plane of FIG. 1, the printed circuit board 4 has its smallest extension (thickness).

As can be seen from FIG. 2, it is preferably provided that the carrier section 40 protrudes into the flow channel 23, so that the sensor 3 is arranged in the flow channel 23 and can be sufficiently contacted there by the air flow L to be measured. The sensor 3 may thereby be arranged on the bottom side 4a of the printed circuit board 4, as shown in FIG. 1 (alternatively, an arrangement on the top side 4b is also possible, see below). Thus, the sensor module 1 can determine an ambient temperature of the sensor module 1 by sucking and measuring an air flow L having the ambient temperature.

As can be seen from FIGS. 1 and 2, the housing 2 of the sensor module 1 comprises a housing top 2a and a housing bottom 2c opposite the housing top 2a, the housing top 2a and the housing bottom 2c being connected to one another via a side wall 2b of the housing 2.

As shown, for example, in FIG. 8, the housing of the sensor module 1 may in principle comprise a housing upper part 24 and a housing lower part 25 connected thereto, wherein the housing upper part 24 forms the housing top 2a, and wherein the housing lower part 25 forms the housing bottom 2c. The side wall 2b can thereby be formed by the upper housing part 24 and/or the lower housing part 25.

Furthermore, according to FIGS. 1 and 2, it is preferably provided that the air inlet 21 is formed by a nozzle 26 projecting from the side wall 2b, which nozzle 26 may for example be of hollow cylindrical configuration.

Further, the flow channel 23 downstream of the air inlet or nozzle 21 as shown in FIG. 2 may be bounded by a wall portion 23a of the housing 2 facing the top side 4a of the printed circuit board 4 and sloping towards the top side 4a of the printed circuit board 4 so as to be disposed at an acute angle W with respect to the top side 4a of the printed circuit board 4. Further, the top side 4a of the printed circuit board 4 faces, in particular, the housing top 2a. In particular, the wall portion 23a may also have a curvature.

Furthermore, it is preferably provided that said direction T along which the carrier portion 40 protrudes from the base portion 43 of the printed circuit board 4 extends perpendicularly to the axis of rotation z and further preferably parallel to the flow direction x of the air flow L in the region of the air inlet 21 of the housing 2. The air flow L can thus be guided along or past the carrier portion 40 on which the sensor 3 is arranged, so that the sensor 3 can be flowed against in an advantageous manner by the air flow L.

As can further be seen from FIGS. 1 and 2, the fan 6 may be configured as an axial fan, wherein the rotor 61 is configured to draw in the air flow L in the direction of the axis of rotation z and to discharge it in the same direction. For this purpose, it is provided in particular that the flow channel 23 extends from the air inlet 21 along the housing bottom 2c to a bottom side 61b of the rotor 61 facing the housing bottom 2c, so that the air flow L is sucked in by the rotor 61 in a direction facing the housing top 2a (parallel to the axis of rotation z). In this case, the air outlet 22 of the housing 2 or flow channel 23 is preferably formed in the housing top 2a of the housing 2.

The terminal 5, which is provided in particular on the upper side 4a of the printed circuit board 4, is preferably in the form of a plug connector and can have a multiplicity of electrically conductive contact pins 50, which preferably project perpendicularly to the printed circuit board 4 from the upper side 4a of the printed circuit board 4, for making electrical contact with the sensor module 1. The housing 2 may have an opening above the contact pins 50, which forms a guide 51 or receptacle for the terminal 5 and may be designed to positively receive a plug contacting the contact pins 50.

Figure 3:
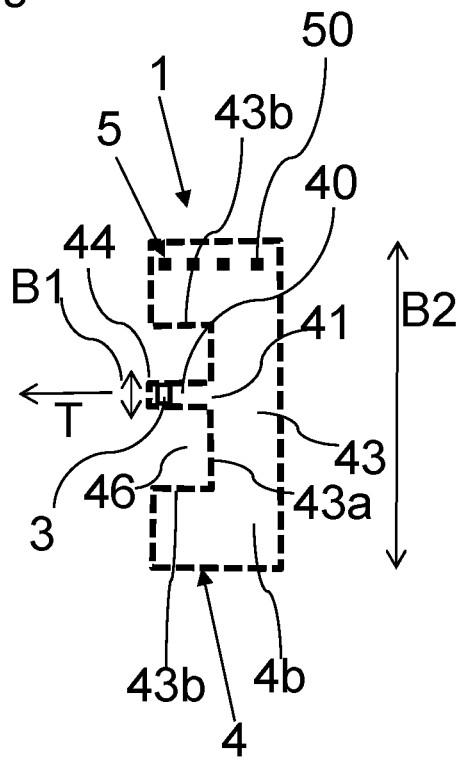

FIGS. 3 to 7 show different ways of forming the carrier portion 40 of the printed circuit board 4 of the sensor module 1, the variant shown in a plan view in FIG. 3 corresponding to the printed circuit board 4 shown in FIG. 1.

According to the embodiment shown in FIGS. 1 and 3, it is provided that the carrier portion 40 is preferably longitudinally elongated and comprises a free end region 44 opposite the first connecting region 41 of the carrier portion 40, on which the sensor 3 is arranged.

In this case, the carrier portion 40 is protruding from the base portion 43 in said direction T in a recess 46 of the base portion 43 of the printed circuit board 4, in particular the recess 46 being delimited by a middle edge 43a of the base portion 43 and by two opposite lateral edges 43b of the base portion 43 which are connected to each other via the middle edge 43a. Referring to FIGS. 1 and 3, the carrier portion 40 may protrude from the middle edge 43a of the base portion 43, for example. According to FIGS. 1 and 3, the end region 44 does not protrude in the direction T beyond the base portion 43.

Figure 4:
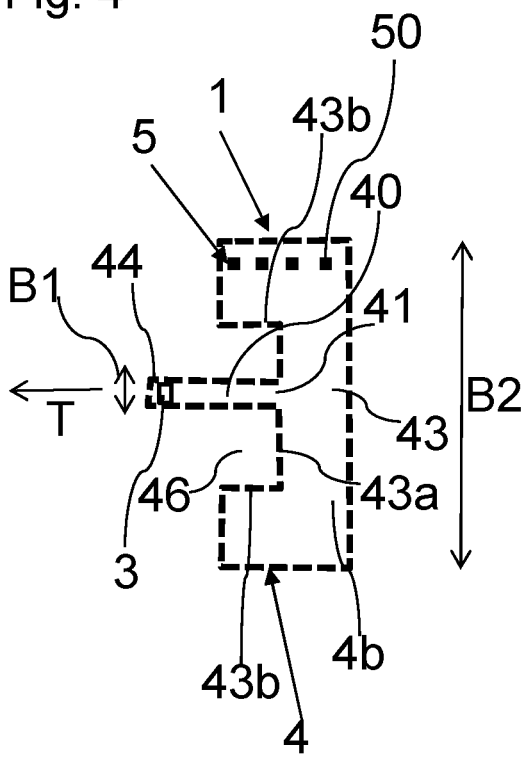

FIG. 4, on the other hand, shows an alternative embodiment of the printed circuit board 4 in which the end region 44, in contrast to FIG. 3, projects beyond the entire base portion 43 in the said direction T. Such an embodiment can be used, for example, to allow the end region 44 or sensor 3 to protrude into the air inlet 21. In the configurations of the circuit board 4 shown in FIGS. 3 and 4 (as well as in the configurations according to FIGS. 5 and 7), the recess 46 allows the air flow L to pass by the carrier portion 40 or the sensor 3.

Figure 5:
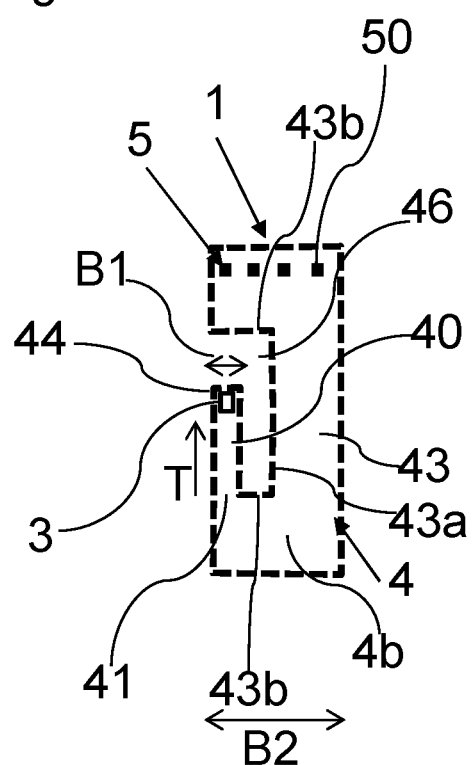

As an alternative to the middle edge 43a, the carrier portion 40 shown in FIG. 5 may also project from a lateral edge 43b to form an L-shaped recess 46.

Furthermore, according to FIG. 7, it is possible that the carrier portion 40 (e.g. projecting from the middle edge 43a) is meander-shaped.

Finally, the carrier portion 40 according to FIG. 6 may further be connected to the base portion 43 via a second connecting region 42, so that the carrier portion 40 and the base portion 43 together delimit an e.g., rectangular through opening or recess 47 of the printed circuit board 4. Here, the sensor 3 may be arranged on a central region 45 of the carrier portion 40, which is arranged between the first and the second connecting regions 41, 42 of the carrier portion 40 and connects the first and the second connecting regions 41, 42 of the carrier portion 40 to each other.

FIG. 8 shows a possibility for mounting a sensor module 1 according to the invention. Preferably, the housing 2 is divided into two parts to achieve a simple construction of the sensor module 1 and has a lower housing part 25 and an upper housing part 24 (see also above). Initially, the printed circuit board 4 and the fan 6 may be inserted into the lower housing portion 25, with the terminal 5 and the sensor 3 already arranged on the printed circuit board 4. Further, the fan 6 is already electrically connected to the PCB 4 (and may also be arranged on the PCB 4). After arranging the printed circuit board 4 and the fan 6, the upper housing part 24 is fixed to the lower housing part 25. The air inlet 21 or nozzle 21 may be formed together with the wall section 23a, for example, on the upper housing part 24 (alternatively, the nozzle 21/wall section 23a may also be formed on the lower housing part 25).

According to the embodiment of the sensor module 1 shown in FIGS. 9 and 10, it may further be provided that the printed circuit board 4, in particular the base portion 43, partially extends below the fan 6 (in particular below the rotor 61), so that a corresponding section of the printed circuit board 4 or of the base portion 43 faces the fan 6, in particular the rotor 61, in a direction parallel to the axis of rotation z. This can facilitate an electrical connection of the fan 6 to the printed circuit board 4.

Furthermore, the nozzle 21 can be arranged offset with respect to a central axis M, along which the housing 2 of the sensor module 1 can extend according to the embodiment shown in FIG. 11, and in particular in a direction y running perpendicular to the axis of rotation z, which runs parallel to the top side 4*a* or bottom side 4*b* of the printed circuit board 4. In this way, the flow pattern in the flow channel 23 can be specifically influenced. Furthermore, it is thus possible to bring the nozzle 21 outwardly into a position which may be more favourable for installation.

As has been described above with reference to FIGS. 1 and 2, the printed circuit board 4 or the carrier portion 40 may extend in the interior space 20 of the housing 2 perpendicularly to the axis of rotation z of the rotor 61.

Alternatively, however, according to FIGS. 12 to 14, an embodiment of the sensor module 1 is also provided in which the printed circuit board 4 or said direction T along which the carrier portion 40 protrudes from the base portion 43 of the printed circuit board 4 extends parallel to the axis of rotation z.

Here again, the side of the printed circuit board 4 designated as the top side 4*a* faces the fan 6 or the side wall 2*b* of the housing 2. The vertical arrangement of the printed circuit board 4 permits a particularly simple arrangement of the sensor 3 in the flow channel 23 opposite the air inlet 21, as can be seen in particular from FIG. 13. Due to the vertical arrangement of the printed circuit board 4, the receptacle or guide 51 of the terminal 5 is provided laterally on the side wall 2*b* (cf. FIG. 14), so that easy access to the contact pins 50 from the outside is ensured.

FIGS. 15 to 16 show a modification of the embodiment shown in FIGS. 1 and 2, wherein here, in contrast to FIGS. 1 and 2, the fan 6 is designed as a radial fan, wherein the rotor 61 is configured to suck in the air flow L in the direction of the axis of rotation z and to discharge it in the radial direction R of the rotor 61. In this case, the flow channel 23 extends starting from the air inlet 21 along the housing bottom 2*c* to a bottom side 61*b* of the rotor 61 facing the housing bottom 2*c*, so that the air flow L is initially drawn in towards the housing top 2*a*, but is then deflected by the rotor 61 in the radial direction R and is discharged through the air outlet 22, which in the present case is arranged in the side wall 2*b*.

As further shown in FIGS. 17 and 18, the fan 6 may in principle also be arranged on the printed circuit board 4, in particular on its top side 4*a*, and preferably on the base portion 43, and may be immediately electrically connected there, for example by soldering corresponding contacts of the fan 6 to associated conductor tracks of the printed circuit board 4. Likewise, the fan 6 may in principle be connected to the printed circuit board 4 via a further terminal (for example in the form of a plug connector).

More specifically, according to FIGS. 19 to 21, the motor 60 of the fan 6 may comprise a coil 62 arranged on the top side 4*a* of the printed circuit board 4, and in particular on the base portion 43, where it is connected to conductive tracks of the printed circuit board 4 by solder connections. The motor 60 may further comprise a magnet 63 arranged on the rotor 61 and facing the coil 62.

Preferably, the rotor 61 is fixed to a shaft 64 of the motor 60 extending along the axis of rotation z and supported by means of a bearing 65, the bearing 65 being held by means of a bearing support 66 projecting from the housing bottom 2*c* in the direction of the axis of rotation z towards the housing top 2*a*. Preferably, the bearing support 66 is integrally molded to the housing bottom 2*c*, for example by injection molding the housing bottom 2*c* and the bearing support 66. The bearing support 66 may further extend through a through hole 4*c* of the printed circuit board 4. This allows easy electrical connection of the fan 6 to the circuit board 4, as well as secure mounting of the shaft 64 on the housing bottom 2*c*.

According to FIG. 19, an assembly of the sensor module 1 can be carried out by providing a lower housing part 25 of the housing 2, wherein the bearing support 66, which receives the bearing 65, is already formed on the housing bottom 2*c* of the lower part 25. On this, the printed circuit board 4 can be arranged, on which the sensor 3 (as well as possibly further electronic components 70, 71, 72), the terminal 5 and the coil 62 for the fan 6 are already arranged. After arranging the printed circuit board 4, the rotor 61 with the shaft 64 can be inserted into the bearing 65, the bearing 65 being accessible via the through-opening 4*c* of the printed circuit board 4.

Apart from the sensor 3, further electronic components 70, 71, 72 may be arranged on the printed circuit board 4, as shown in FIGS. 19 to 21. These may be, for example, a LIN transceiver 72, a microcontroller 70, an ESD protection component 71, and a motor controller which may be arranged in the fan 6.

According to an embodiment (cf. FIGS. 18 and 20), the further components 70, 71, 72 are preferably arranged, like the sensor 3, on the bottom side 4*a* of the printed circuit board 4 facing the housing bottom 2*c*. The arrangement on the same side of the printed circuit board 4 allows easy assembly and soldering of the printed circuit board 4.

Alternatively, however, as shown in FIG. 21, it may also be provided that the sensor 3 provided on the end region 44 of the carrier portion 40 is arranged on the top side 4*a* of the printed circuit board 4, which may allow a better flow of air L generated by the fan 6 to the sensor 3.

Finally, FIGS. 22 and 23 show further embodiments of the sensor module 1 in which, in contrast to the embodiments described above, the flow channel 23 is guided starting from the air inlet 21 along the housing top 2*a* to a top side 61*a* of the rotor 61 facing the housing top 2*a*. Thus, the air flow L can be initially drawn in by the rotor 61 in the FIGS. 22 and 23 in the direction of the axis of rotation z towards the housing bottom 2*c*.

According to FIG. 22, the fan 6 in this case is designed as a radial fan 6, so that the air flow L in the radial direction R of the rotor 61 is emitted from the housing 2 through an air outlet 22 formed in the side wall 2*b* of the housing 2.

Alternatively, the fan 6 shown in FIG. 23 is designed as an axial fan 6, wherein here the air flow L is discharged axially through an air outlet 22 provided in the housing base 2*c*.

FIG. 24 shows, in connection with FIGS. 25 to 28, a further embodiment of a sensor module 1 according to the invention for measuring an ambient temperature, this being a modification of the embodiment shown in FIG. 12. According to FIG. 24, the sensor module 1 comprises a housing 2 which forms a longitudinally extending flow channel 23 with an air inlet 21 and an air outlet 22. A printed circuit board 4 is arranged in the interior space 20 of the sensor module 1, wherein the sensor 3 is arranged on the printed circuit board 4 (for example, a surface-mounted device (SMD)), which is designed to measure, for example, a temperature and/or a relative humidity, and/or a gas concentration of the air flow L passing the sensor 3. Furthermore, a terminal 5 for electrically contacting the sensor module 1 is provided on the printed circuit board 4, the terminal being designed in particular for electrically contacting the sensor 3 and/or for supplying the sensor module 1 with an operating voltage (in particular for the motor and the sensor). In this respect, an output signal of the sensor 3 can be present at the terminal, so that measured values (e.g., temperature, relative humidity and/or gas concentration) can be read out via the connection 5.

The fan 6 arranged in the interior space 20 of the sensor module 1 comprises a rotor 61 rotatable about an axis of rotation z and is electrically conductively connected to the printed circuit board 4 via a terminal 52 arranged on the upper side 4a of the printed circuit board 4. The air flow L generated by the fan 6 is drawn into the flow channel 23 of the sensor module 1 via the air inlet 21 and is discharged from the housing 2 or the flow channel 23 through the air outlet 22 formed in the housing top 2a, so that the air flow L flows past the sensor 3 in the housing 2 or in the flow channel 23 and flows upstream of the sensor 3 in the air inlet 21 along a flow direction x which is preferably perpendicular to the axis of rotation z, i.e., is at an angle V to the axis of rotation z which is preferably 90°.

According to FIGS. 27 and 28 (as previously described, for example, with reference to FIG. 5), the printed circuit board 4 can comprise a carrier portion 40 on which the sensor 3 is arranged, in which case the carrier portion 40 protrudes into the flow channel 23, so that the sensor 3 is arranged in the flow channel 23 and can be sufficiently contacted there by the air flow L to be measured. In this regard, the sensor 3 may be arranged, for example, on the bottom side 4b or the top side 4a of the printed circuit board 4. The bottom side 4b faces the air inlet 21. In contrast, the top side 4a of the printed circuit board 4 faces the fan 6. Preferably, the printed circuit board 4 is arranged parallel to the axis of rotation z of the rotor 61 of the fan 6 as well as perpendicular to the flow direction x. The fan 6 is configured as an axial fan, which sucks in air via the bottom side 61b of the rotor 61 and discharges it from the air outlet 22 in the direction of the axis of rotation z.

As can be seen from FIGS. 25 and 26, the housing 2 of the sensor module 1 has a housing top 2a and a housing bottom 2c opposite the housing top 2a, the housing top 2a and the housing bottom 2c being connected to one another via a side wall 2b of the housing 2 (cf. FIG. 24). As further shown in FIGS. 25 and 26, the housing 2 of the sensor module 1 comprises a housing upper part 24 and a housing lower part 25 connected thereto, wherein the housing upper part 24 forms the housing top 2a, and wherein the housing lower part 25 forms the housing bottom 2c. The side wall 2b can be formed by the upper housing part 24 and the lower housing part 25.

The terminal 5, which is provided in particular on the top side 4a of the printed circuit board 4, is preferably in the form of a plug connector and has a plurality of electrically conductive contact pins 50 which preferably project from the top side 4a of the printed circuit board 4 perpendicularly to the printed circuit board 4. The housing 2 comprises, on the housing bottom 2c or on the housing lower part 25, an opening 51 extending perpendicularly to the contact pins 50, which opening 51 forms a guide 51 or receptacle for the plug connector 5 and can be designed to positively receive a plug contacting the contact pins 50. The guide or plug receptacle 51 is shown in particular in FIG. 28, which shows the part of the side wall 2b of the housing 2 facing away from the inlet opening 21.

Furthermore, the upper housing part 24 may be connected to the lower housing part 25 via latching lugs provided on the upper housing part 24 which engage in corresponding openings in the lower housing part. The latching lugs may of course also be provided on the lower housing part. The corresponding openings would then be arranged on the upper housing part.

The invention claimed is:

1. A sensor module (1) for measuring at least one measurand, comprising:
a housing (2) comprising a flow channel (23) with an air inlet (21) and an air outlet (22), the housing (2) surrounding an interior space (20) of the housing (2),
a printed circuit board (4) arranged in the interior space (20),
at least one sensor (3) arranged on the printed circuit board (4), which is designed to measure at least one measurand of an air flow (L) guided past the sensor (3),
a terminal (5) arranged on the printed circuit board (4) for electrically contacting the sensor module (1), and
a fan (6) comprising a motor (60) and a rotor (61) which can be rotated about an axis of rotation (z) by means of the motor (60), the motor (60) being electrically conductively connected to the printed circuit board (4), wherein the fan (6) is designed to generate an air flow (L) in the flow channel (23) between the air inlet (21) and the air outlet (22), so that the air flow (L) flows past the sensor (3) and, in the region of the air inlet (21), flows along a flow direction (x) which runs at an angle (V) to the axis of rotation (z) which is in the range from 45° to 90°, wherein
the printed circuit board (4) comprises a carrier portion (40) on which the sensor (3) is arranged, the carrier portion (40) being connected to a base portion (43) of the printed circuit board (4) via at least a first connecting region (41) of the carrier portion (40), wherein the carrier portion (40) or the first connecting region (41) comprises a width (B1) perpendicular to a direction (T) in which the carrier portion (40) protrudes from the base portion (43), which is smaller than a width (B2) of the base portion (43) perpendicular to the direction (T), wherein the carrier portion (40) protrudes into the flow channel (23).

2. The sensor module according to claim 1, characterized in that the sensor (3) is arranged upstream of the fan (6) with respect to the flow direction (x).

3. The sensor module according to claim 1, characterized in that the angle (V) is in the range from 60° to 90°, in particular in the range from 75° to 90°, in particular in the range from 80° to 90°, the angle (V) preferably being 90°.

4. The sensor module according to claim 1, characterized in that the at least one measurand is one of the following measurands: a temperature of the air flow (L) passing the sensor (3), a relative humidity of the air flow (L) passing the sensor (3), a gas concentration of the air flow (L) passing the sensor (3).

5. The sensor module according to claim 1, characterized in that the carrier portion (40) comprises an end region (44) opposite the first connection portion (41) of the carrier portion (40), on which the sensor (3) is arranged.

6. The sensor module according to claim 1, characterized in that, in a recess (46) of the base portion (43), the carrier portion (40) protrudes in said direction (T) from the base portion (43).

7. The sensor module according to claim 1, characterized in that the carrier portion (40) is meander-shaped.

8. Sensor module according to claim 1, characterized in that the housing (2) comprises a housing top (2a) and a housing bottom (2c) opposite the housing top (2a), the housing top (2a) and the housing bottom (2c) being connected to one another via a side wall (2b) of the housing (2).

9. Sensor module according to claim 1, characterized in that the printed circuit board (4) has a top side (4a) and a bottom side (4b) facing away from the top side (4a).

10. Sensor module according to claim 1, characterized in that the housing (2) extends along a central axis (M), the air inlet (21) being arranged offset from the central axis (M) in a direction (y) perpendicular to the axis of rotation (z).

11. Sensor module according to claim 1, characterized in that the printed circuit board (4) and/or said direction (T) along which the carrier portion (40) protrudes from the base portion (43) of the printed circuit board (4) extends perpendicularly to the axis of rotation (z).

12. Sensor module according to claim 1, characterized in that the printed circuit board (4) and/or said direction (T) along which the carrier portion (40) protrudes from the base portion (43) of the printed circuit board (4) extends parallel to the axis of rotation (z).

13. Sensor module according to claim 1, characterized in that at least one further electronic component (70, 71, 72) is arranged on the printed circuit board (4).

14. Sensor module according to claim 1, characterized in that the terminal (5) is designed as a plug connector.

* * * * *